United States Patent [19]

Haken et al.

[11] Patent Number: 4,821,085

[45] Date of Patent: Apr. 11, 1989

[54] VLSI LOCAL INTERCONNECT STRUCTURE

[75] Inventors: Roger A. Haken, Richardson; Thomas C. Holloway, Dallas, both of Tex.

[73] Assignee: Texas Instruments Incorporated, Dallas, Tex.

[21] Appl. No.: 729,318

[22] Filed: May 1, 1985

[51] Int. Cl.$^4$ .................. H01L 29/78; H01L 27/02; H01L 23/48; H01L 29/46

[52] U.S. Cl. .................. 357/67; 357/23.1; 357/23.9; 357/42; 357/71

[58] Field of Search .............. 357/67, 71, 23.15, 23.1, 357/23.9, 42, 67, 71

[56] References Cited

U.S. PATENT DOCUMENTS

| | | | |
|---|---|---|---|
| 3,879,746 | 4/1975 | Fournier | 357/71 |
| 4,178,605 | 12/1979 | Hsu et al. | 357/42 |
| 4,305,200 | 12/1981 | Fu et al. | 29/571 |
| 4,378,628 | 4/1983 | Levinstein et al. | 29/571 |
| 4,384,301 | 5/1983 | Tasch, Jr. et al. | 357/23 |
| 4,392,150 | 7/1983 | Courreges | 357/51 |
| 4,502,209 | 3/1985 | Eizenberg et al. | 29/589 |
| 4,545,116 | 10/1985 | Lau | 357/67 |
| 4,570,328 | 2/1986 | Price et al. | 357/65 X |
| 4,577,391 | 3/1986 | Hsia et al. | 29/571 |
| 4,593,454 | 6/1986 | Baudrant et al. | 29/571 |
| 4,605,947 | 8/1986 | Price et al. | 357/23.15 |
| 4,635,347 | 1/1987 | Lein et al. | 29/591 |
| 4,652,812 | 3/1987 | Gimpelson et al. | 324/65 R |
| 4,674,174 | 6/1987 | Kishita et al. | 29/578 |
| 4,675,715 | 6/1987 | Lepselter et al. | 357/59 |
| 4,677,735 | 7/1987 | Malhi | 29/571 |

FOREIGN PATENT DOCUMENTS

| | | | |
|---|---|---|---|
| 0021400 | 1/1981 | European Pat. Off. | 23/52 |
| 0098737 | 1/1984 | European Pat. Off. | 27/08 |
| 8203948 | 11/1982 | World Int. Prop. O. | 29/04 |

OTHER PUBLICATIONS

"A New Device Interconnect Scheme for Sub-Micron VLSI", Chen et al., IEDM 84, pp. 118-119.
"Silicide for Contacts and Interconnects", Ting IEDM, 1984, pp. 110-113.
Ting, Tin Formed by Evaporation as a Diffusion Barrier Between Al and Si, J. Vac. Sci. Technol. 21(1) May/Jun. 1982.
M. E. Alperim et al., "Development of the Self-Aligned Titanium Silicide Process of VLSI Applications", *IEEE Transactions on Electron Devices*, vol. ED-32, (1985) pp. 141-149.
D. C. Chen et al., "A New Device Interconnect Scheme for Sub-Micron VLSI", *IEDM* 84 (1984) pp. 118-121.
M. Wittmer et al., "Applications of TiN Thin Films in Silicon Device", *Thin Solid Films*, vol. 93 (1982) pp. 397-405.
F. H. De La Moneda, "Self-Aligned Silicide Buried Contacts", *IBM Technical Disclosure Bulletin*, vol. 24, No. 7A, Dec. 1981, pp. 3454-3457.
V. L. Rideout, "Method of Fabricating MOSFET Integrated Circuits with Low Resistivity Interconnection Lines", *IBM Technical Disclosure Bulletin*, vol. 23, No. 6, Nov. 1980, pp. 2563-2566.
Ting, "Silicide for Contacts and Interconnects", IEDM 84, pp. 110-113.
Tsang, "Forming Thick Metal Silicide for Contact Barrier", *IBM Technical Disclosure Bulletin*, vol. 19, No. 9, Feb. 1977, pp. 3383-3385.

*Primary Examiner*—J. Carroll
*Attorney, Agent, or Firm*—Rodney M. Anderson; Leo N. Heiting; Melvin Sharp

[57] ABSTRACT

A local interconnect system for VLSI integrated circuits. During self-aligned silicidation of exposed moat and gate regions in a nitrogen atmosphere, a conductive titanium nitride layer is formed overall. Normally this conductive layer is stripped to avoid shorting out devices. However, the present invention patterns this conductive layer, thereby providing a local interconnect with the sheet resistance of the order of one ohm per square. Moreover, this local interconnect level permits contacts to be misaligned with the moat boundary, since the titanium nitride local interconnect layer can be overlapped from the moat up on to the field oxide to provide a bottom contact and diffusion barrier for a contact hole which is subsequently etched through the interlevel oxide. This local interconnect level fulfills all of the functions which a buried contact layer could fulfill, and fulfills other functions as well.

12 Claims, 3 Drawing Sheets

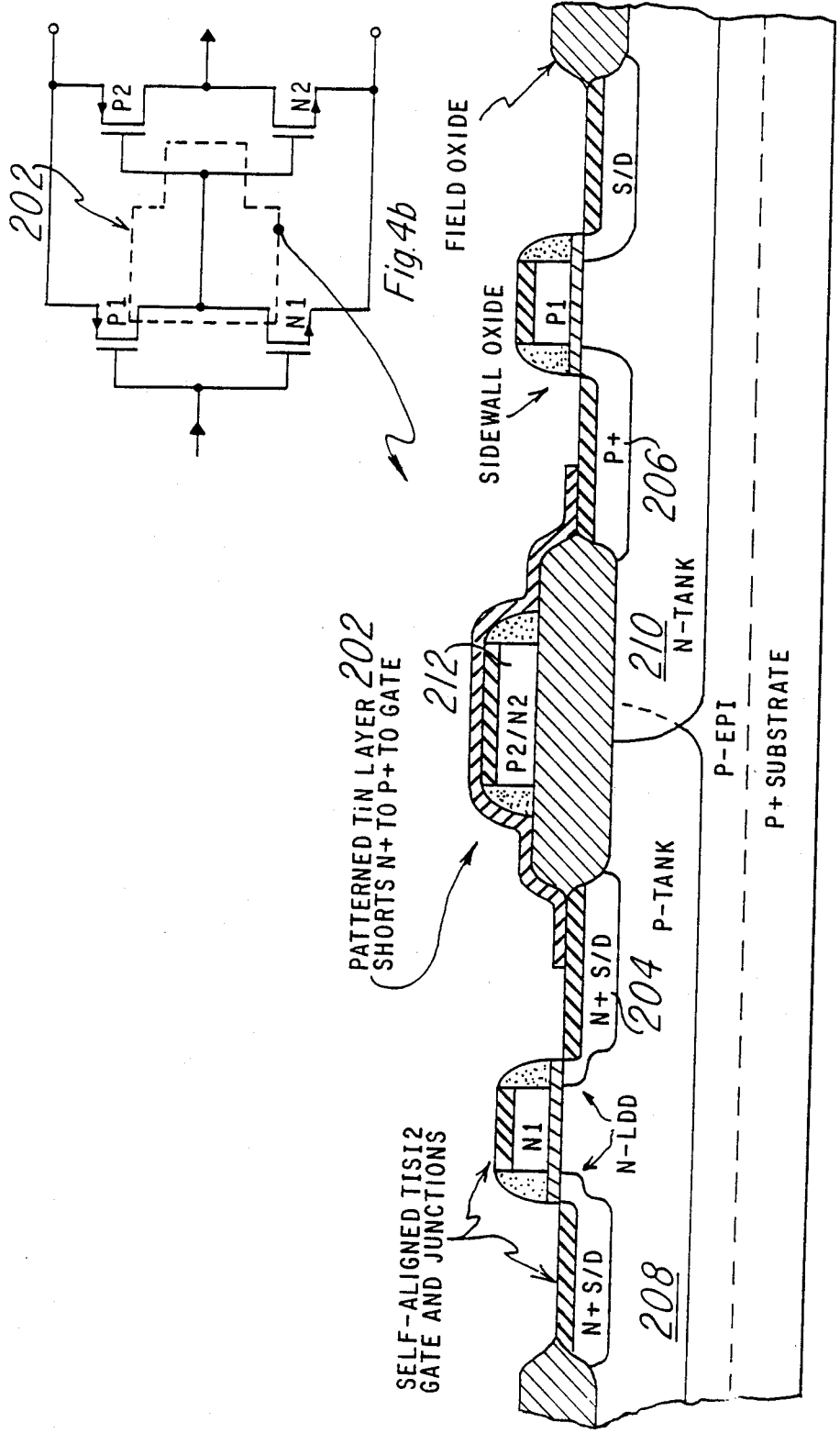

VLSI LOCAL INTERCONNECT STRUCTURE

BACKGROUND AND SUMMARY OF THE INVENTION

The present invention relates to very large scale integrated circuits, and to methods for fabrication thereof.

Interconnect technology is increasingly a major limitation in the fabrication of very large scale integrated circuits. In particular, the use of multiple patterned polysilicon or metal layers for interconnects places great pressure on the processing technology related to etching of contact holes and planarization of interlevel dielectrics. However, the additional routing capability which is provided by any additional level of interconnect will often give circuit designers options which translate into more compact layouts, better circuit performance, and/or greater ease of circuit design.

For these reasons much effort has been dedicated to modifying processes to include a buried contact. A buried contact process is a process which uses a single layer to form not only MOS gates, but also, using other patterned portions of the same layer, contact to the source/drain regions of MOS transistors. That is, the same thin film polysilicon or polycide layer must in some locations be separated from the moat by a very thin high-integrity gate oxide, and in other locations must form an ohmic contact to highly doped moat regions. This leads to three main classes of processing problems: first, gate oxide integrity becomes more difficult to preserve. Second, scalability is limited by interdiffusion between the polysilicon material and the bulk silicon. That is, the phosphorus doping used to make the polysilicon conductive will normally outdiffuse into the silicon substrate at the contact location. However, as devices are scaled to small geometries, this phosphorus diffusion can counterdope a major fraction of the channel stop doping, leading to leakage between active areas. Third, first contacts are highly desirable in CMOS processing, but present technology does not provide any manufacturable process to make contact to P+ moat regions. Not only is there the problem of how to avoid a diode between N+ poly and P+ substrate, but similar problems of dopant outdiffusion may lead to shorting from the poly to the PMOS substrate at first contacts to P+.

There have been published suggestions of ways to provide a local interconnect level in the context of a self-aligned titanium silicide process for source/drain silicidation. The self-aligned titanium silicide source/drain silicidation process is disclosed in U.S. patent application Ser. No. 492,069, filed May 6, 1983, (TI-9596), now U.S. Pat. No. 4,545,116, which is hereby incorporated by reference. In this process, metallic titanium is deposited overall, and is then heated in a nitrogen atmosphere so that the titanium reacts with exposed silicon surfaces (such as source/drain regions, or exposed upper surfaces of polysilicon lines) to form titanium silicide. The portions of titanium which did not react to form silicides are then stripped (using, for example, a wet etch). This process provides a self-aligned silicidation process without any patterning steps. This self-aligned silicidation process has come into wide use in integrated circuit fabrication.

The previously proposed local interconnect schemes based on this process use additional patterned silicon to provide conductive silicide regions extending out over the field oxide as desired. That is, in the process developed by Hewlett Packard and published at Page 118 of the 1984 IEDM Proceedings, (which publication is hereby incorporated by reference), after the titanium metal is deposited overall, and before heat is applied to effect silicide reaction, a thin layer of silicon (either polycrystalline or amorphous) is patterned on top of the titanium metal. Where this silicon layer has been applied, a silicide will form during the reaction process, so that silicides can be formed extending over the gate sidewall oxide or over the field oxide. A similar approach previously developed at Texas Instruments used patterned silicon straps which were applied before the titanium metal was applied.

However, both of these approaches have the limitation that deposition of an additional layer is required. Thus, both of these approaches contain excess processing complexities.

Other publications relevent to examination of the present application may be found in the paper by C. Y. Ting at page 110 of the 1984 IEDM proceedings (and see especially page 113) and in the paper by M. Alperin et al., Development of the Self-aligned $TiSi_2$ Process for VLSI applications, at page 141 of the February 1985 issue of the IEEE transactions on Electron Devices.

The present invention provides a simpler method of forming local interconnects in the context of a self-aligned direct-react titanium silicide process for source/drain (and preferably gate) silicidation.

It has been discovered that when the direct-react titanium silicide silicidation process is performed in a nitrogen atmosphere, a surface layer of titanium nitride (TiN) is formed in the titanium metal layer over field oxide. Thus, after the silicide reaction occurs, the portions of the deposited titanium metal layer which have not been in contact with a source of silicon (and therefore have not formed silicide) are not merely unreacted titanium metal, but include a large fraction of titanium nitride. The present invention makes use of this titanium nitride layer to provide a new and advantageous local interconnect method and structure.

After the silicidation step, the titanium nitride layer is patterned and selectively removed from titanium silicide and silicon oxide regions where it is not desired. After this, a final anneal is performed at higher temperature (e.g. 800 C) to reduce the final sheet resistance of the titanium silicide layers to below one ohm per square.

This provides a structure wherein moat-to-moat interconnections have been formed using a very thin (e.g. 1000 angstroms) layer of titanium nitride. Not only is the processing simpler than the methods for forming titanium silicide local interconnects discussed above, but also the present invention provides further advantages as well. First, titanium nitride is a very good diffusion barrier, so problems of interdiffusion through the silicide are avoided. This is particularly advantageous where the local interconnect layer is used to connect a p+ moat region to an n+ moat region in CMOS processing. Second, as noted, the titanium nitride layer is extremely thin, so that the amount of additional vertical topography induced in subsequent unplanarized layers is minimal. Third, since the titanium nitride layer is so thin, the etch used to remove it need not be anisotropic, which again simplifies processing. Fourth, even a very thin titanium nitride layer can provide very low sheet resistances, of the order of one to five ohms per square, or even less. Fifth, this titanium nitride layer provides a diffusion barrier in place for contacts. That is, contacts to moat can deposit metal on top of the titanium nitride layer rather than directly on silicon, so that interdiffusion between metal and silicon is effectively prevented. This simplifies the selection of interconnect metallization. Sixth, the overlap of the titanium nitride onto the field oxide means that the contact holes need not be perfectly aligned to the edge of the moat, but the contact hole can overlap onto the titanium nitride over the upper surface of the edge of the field oxide. Seventh, the capability of the present invention will permit the elimination of double-level metal (DLM) process steps in some processes, without any sacrifice of speed or area, since this provides a lower interconnect layer of such good conductivity that strapping is not necessary. Eighth, the number of second contacts in a layout can be reduced, since independent interconnection through the TiN layer can substitute for some metal interconnects. Ninth, the present process is inherently amenable to shared contacts, i.e. to contacts where contact is made between two interconnect layers and substrate at the same location. Tenth, the methods using silicon straps for local interconnect are inherently susceptible to open circuit defects where the silicon strap crosses the angle at the foot of the gate, and, to avoid this, the silicon straps need to be made relatively thick (as much as 2500 A thick in some processes), which degrades topography and throughput. By contrast, the TiN straps of the present invention do not have this problem, and therefore do not need to be made so thick. Eleventh, titanium nitride is more resistant to oxide etches than titanium silicide is, so that damage caused by over-etching the multilevel oxide at the contact etch step in a process using a planarized multilevel oxide are reduced. Twelfth, the capability of overlapping moat contacts up onto the field oxide means that minimum geometry can be used for the source/drain regions in the moat. Thirteenth, the present invention permits connection between stages of CMOS logic to be accomplished without any contact holes, which provides advantages in area, speed, and yield.

It is well-known in the integrated circuit art that titanium nitride is conductive, and the use of titanium nitride as a conductive diffusion barrier in contacts has been previously published; but no published work is known to discuss the use of titanium nitride to provide local interconnects, as in the present invention.

According to the present invention there is provided:
An integrated circuit comprising:
a silicon substrate;
device isolation regions defining predetermined moat areas;
a plurality of active devices in said moat areas;
titanium nitride local interconnect layer comprising lines of titanium nitride interconnecting predetermined portions of said moat regions over said device isolation regions.

According to the present invention there is also provided: A method for fabricating integrated circuits, comprising the steps of:
providing a substrate;
providing device isolation areas in a predetermined pattern to define predetermined moat regions;
fabricating insulated gate field effect transistors in predetermined locations in said moat regions;
depositing titanium metal over all;
heating said substrate and said titanium metal in a nitrogen-bearing atmosphere, so that said titanium metal reacts with exposed silicon portions of said substrate to form titanium silicides, and other portions of said titanium metal also react with said nitrogen atmosphere to form titanium nitride; and
patterning said titanium nitride layer to provide local interconnection in a predetermined pattern.

BRIEF DESCRIPTION OF THE DRAWINGS

The present invention will be discussed with reference to the accompanying drawings, wherein:

FIGS. 4a and 4b show in its plane a sectional view and an electrical schematic, respectively, of a two-stage inverter, as a sample of the incorporation of the present invention in more complex CMOS logic structures.

DESCRIPTION OF THE PREFERRED EMBODIMENTS

The present invention will be described with reference to sample preferred embodiments, but it must be recognized that the present invention can be widely modified and varied, and the scope of the present invention is not limited except as set forth in the accompanying claims.

Figure 1:
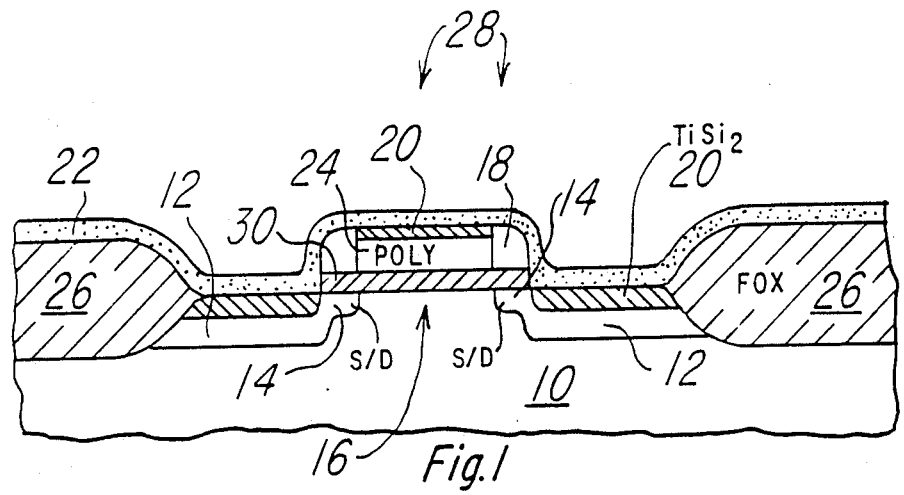
FIG. 1 shows a portion of a moat region after titanium has been deposited and reacted to form titanium silicide regions where silicon was exposed, and titanium nitride elsewhere.

FIG. 1 shows a sample embodiment of the invention. A silicon substrate 10 has had device isolation regions (in this case field oxide region 26) patterned to define moat regions 28 where active devices are to be formed. In the embodiment shown in FIG. 1, the field oxide 26 has the characteristic shape of a LOCOS field oxide, but the present invention can of course be practiced using other isolation technologies, such as sidewall mask isolation or direct moat isolation.

A transistor is shown in moat region 28. This transistor includes source/drain regions 12, including lightly doped source/drain extensions 14 (commonly referred to as LDD regions). A polysilicon gate 24 is capacitively coupled, through gate oxide 30, to channel region 16. The source/drain regions 12 have titanium silicide layers 20 at their surfaces, and another portion of titanium silicide layer 20 also lies on the top surface of polysilicon gate 24. Sidewall oxide filaments 18 separate the polysilicon gate 24 from the silicide regions 20 on the source/drain regions 12.

In the stage of processing shown in FIG. 1, a titanium nitride layer 22 overlies the integrated circuit essentially everywhere. This titanium nitride layer 22 is formed by depositing titanium metal everywhere, and then heating the integrated circuit structure in a nitrogen atmosphere. The titanium nitride layer 22 will typically be thin everywhere, but will be thinner over the silicide regions 20 than over the field oxide 26.

For example, in the presently preferred embodiment the titanium metal is deposited by sputtering to a thickness of 900 angstroms everywhere. The substrate is then heated to 675 degrees C for 60 minutes in an atmosphere of nitrogen and argon at a pressure of 1 atmosphere. This will cause titanium silicide regions 20 to form where the titanium metal is in contact with the silicon. This also causes formation of the titanium nitride layer 22.

The chemistry of the titanium nitridation reaction is not well understood. It is believed that, although the nitridation and silicidation of the silicon are competing reactions, the nitridation is inherently self-limiting (due to the diffusion barrier qualities of TiN), and the silicidation does not effect a very substantial reconversion of nitrides to silicides.

In addition, it has been found that the nitridation of titanium lines running over oxide is sensitive to the particular oxide doping used. The resistance to etching of the nitride layer is different over field oxide regions which have been exposed to different source/drain implant species. Thus, for some processes, use of the local interconnect process of the present invention may also have implications for the selection of the interlevel oxide used.

As this sensitivity indicates, the "titanium nitride" layer of the present invention is almost certainly not pure titanium nitride, but contains other (presumably conductive) titanium compounds as well. The term "titanium nitride layer" is used in the present application to refer to thin film layers which are not necessarily pure titanium nitride, but which may be: (1) more than 30% atomic nitrogen and more than 20% atomic titanium for more than 10% of their thickness, or (2) include a surface layer having a high concentration of titanium nitride and have a bulk concentration of more than 5% at nitrogen.

In the most preferred embodiments of the present invention, the titanium metal is deposited to more than 600 angstroms thick, and the silicide reaction step is performed for less than 90 minutes.

It should also be noted that, depending on the silicidation reaction conditions, the titanium nitride layer 22 may not be entirely stoichiometric at this stage. That is, the layer 22 may contain more than 50 atomic percent of titanium. In some embodiments this may actually be desirable, as will be discussed below.

Figure 2:
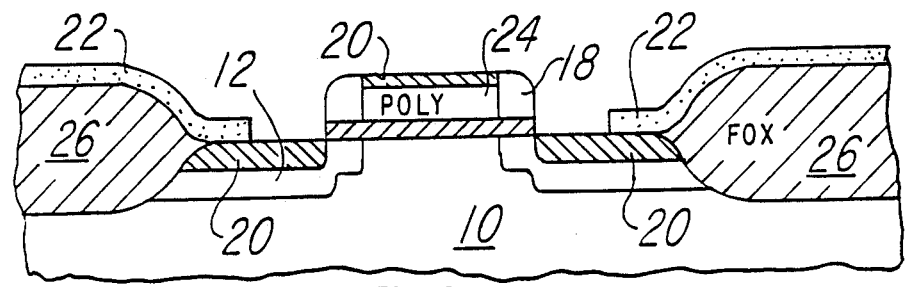
FIG. 2 shows a subsequent stage in the present invention, wherein the titanium nitride layer has been patterned to provide local interconnects and contact pads as desired.
Figure 5:
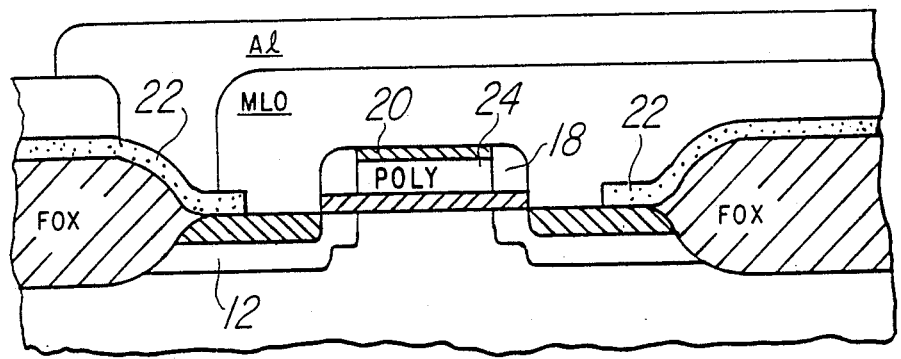
FIG. 5 shows a stage in processing subsequent to that of FIG. 2, wherein portions of the titanium nitride layer are made contact to by metal.

After the silicidation step, the titanium nitride layer 22 is patterned, to produce the structure shown in FIG. 2. In one embodiment of the invention as presently practiced, an oxide hardmask layer is deposited overall to pattern the TIN. That is, a thin oxide layer is deposited overall, for example 1000 angstroms of oxide deposited from a gas flow containing tetraethylorthosilane (TEOS), or of plasma oxide.

This thin oxide layer is then patterned using an etchant gas composition such as $CF_4 + 5\% O_2$. A second etching step, e.g. a wet etch in $H_2O_2$ plus $H_2SO_4$ (a conventional wet etch known as piranha) is then used to pattern the TIN layer 22 in accordance with the pattern formed in the oxide hardmask, without etching away silicide layers 20 or sidewall oxide layers 18.

Alternatively, a hardened photoresist could be used, so that the photoresist layer resists etching by the piranha solution, so that no oxide hardmask is required.

Alternatively, patterned implants (e.g. of oxygen) could be used on the unreacted titanium (or on the reacted interconnect layer) to obtain differential resistance to stripping. (In this case, an additional anneal to obtain better chemical bonding of the implanted species may be required.) For example, it has been found that any inadvertent oxygen contamination makes the reacted titanium nitride layer very difficult to strip, so it is believed that a patterned oxygen implant should be very effective in obtaining selective etching of the reacted layer.

Alternatively, etches exhibiting selectivity of TIN over silicon oxide and titanium silicides could be used instead, without an oxide hardmask. Chlorine- and fluorine-based chemistries are believed to be most suitable for such etches.

After the TIN layer 22 has been patterned as desired, to produce the structure of FIG. 2, a second annealing step is preferably used to lower the sheet resistance of the silicide layers 20 to one ohm per square or less. This second heat treatment step is preferably performed at 800 degrees C for 30 minutes in an argon atmosphere at atmospheric pressure, but these parameters may be varied. For example, the annealing temperature could be in the range of 750 degrees to 875 degrees, or even wider, and the other processing parameters of this step can also be widely varied.

As noted, the titanium nitride layer 22 is not necessarily fully stoichiometric after the initial silicidation step. That is, this layer may contain excess titanium. The presence of excess titanium is advantageous, in some embodiments, since it facilitates the selective removal of the titanium nitride layer 22. If it is desired not to leave excess titanium in the interconnects in the finished intergrated circuit (since titanium is highly reactive), a thinner layer of titanium can be deposited initially.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning.

After the final anneal which lowers the sheet resistance of the silicide has been performed, processing then proceeds in conventional fashion. For example, an interlevel dielectric could now be deposited, such as 1000 angstroms of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as $CF_4$ plus 5% $O_2$, are reasonably selective to TiN.

Figure 3:
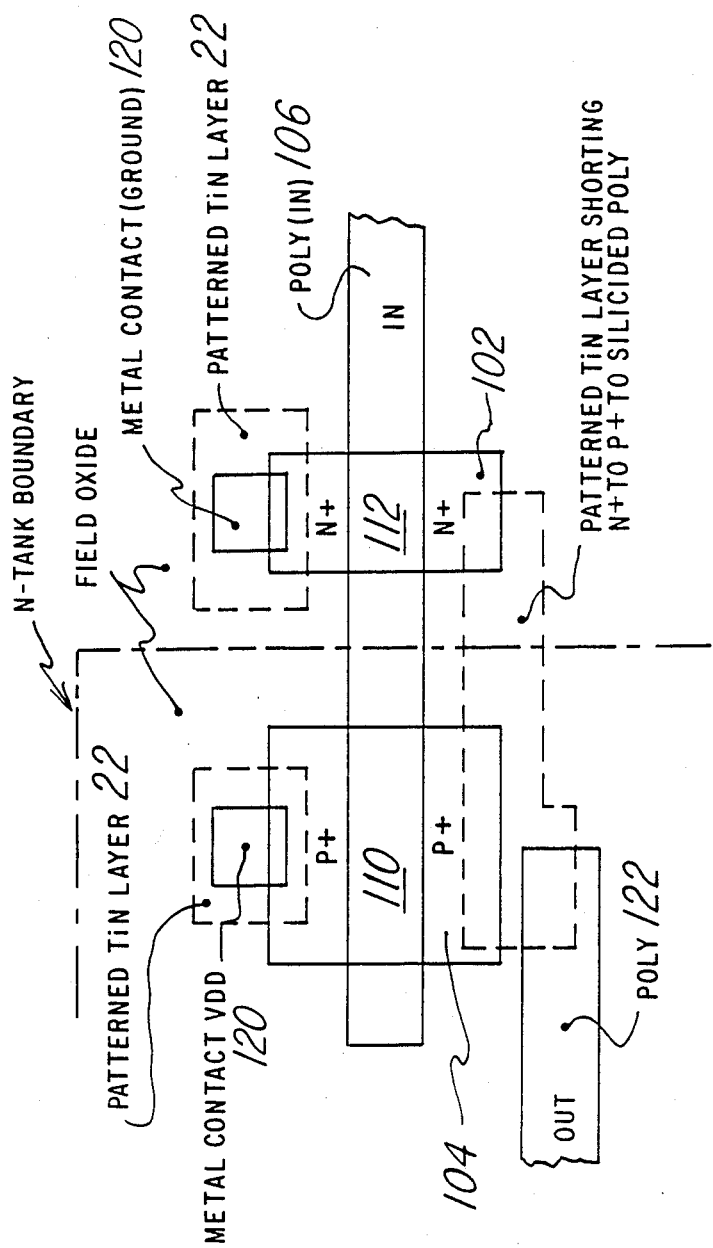
FIG. 3 shows a sample layout of a CMOS inverter using the novel device concepts of the present invention.

An example of the device applicability of this is shown in FIG. 3. FIG. 3 shows a CMOS inverter, wherein an input signal is provided on a polysilicon line 106 which gates both a PMOS transistor 110 in a PMOS moat region 104 and an NMOS transistor 112 in an NMOS moat region 102. Metal contacts 120 are used to connect one source/drain of the PMOS transistor 110 to power supply, and to connect one source/drain of the NMOS transistor 112 to ground. The output of the inverter is provided on a polysilicon line 122 which (in the portion shown) runs over a field oxide. Note that the titanium nitride local interconnect layer 22 is used to connect the polysilicon output line 122 to NMOS moat 102 and to PMOS moat 104, eliminating the need for any buried contact. Note also that other patterned portions of titanium nitride layer 22 are emplaced under the metal contact locations 120, so that the titaniun nitride there in place permits the metal contact 120 to overlap onto field oxide, and also provides a diffusion barrier at the bottom of the metal contact.

FIGS. 4a and 4b show a sectional view and an electrical schematic, respectively, of a two-stage inverter, as a sample of the incorporation of the present invention in more complex CMOS logic structures. Patterned local interconnect layer 202 connects N+ source/drain region 204 in P-tank 208 to P+ source/drain region 206 in N-tank 210, and also connects both of them to polycide line 212 which provides the input to transistors P2 and N2 in the next stage of logic. That is, the output of one stage (transistors P1 and N1) has been connected to the input of the next stage (transistors P2 and N2) WITHOUT ANY CONTACTS.

Thus, the present invention provides the advantage of local interconnect, which can connect moat to poly or moat to moat, including p+ moat to n+ moat, with a simplified processing sequence. Moreover, the present invention provides the further advantage that a diffusion barrier and etch stop can be located at the bottom of contact holes, so that metal contact processing is simplified, and dangers of overetch through field oxide 26 (which could create a short circuit to substrate 10) are reduced.

As will be apparent to those skilled in the art, the present invention can be widely modified and varied, and the scope of the invention is therefore not limited except as set forth in the accompanying claims.

What is claimed is:

1. An integrated circuit comprising:
   a substrate having a silicon upper portion;
   device isolation regions defining predetermined active device areas;
   a plurality of active devices in said active device areas,
      portions of said active devices being formed from a conductive first thin film layer;
   a local interconnect layer
      distinct from said first thin film layer,
      said local interconnect layer comprising lines predominantly comprising titanium nitride,
      said lines of said local interconnect layer interconnecting predetermined portions of said active device regions over said device isolation regions.

2. The device of claim 2, wherein said titanium nitride interconnect lines are less than 2000 angstroms thick.

3. The device of claim 2, wherein said titanium nitride interconnect lines make contact to titanium silicide layers at the surface of said active device regions.

4. The device of claim 2, wherein ones of said titanium nitride lines also make contact to a gate layer in predetermined locations, said gate layer being polycrystalline and comprising a substantial fraction of silicon.

5. The device of claim 2, wherein said active device regions are covered by an interlevel dielectric having contact holes filled with metal therein, said metal in said contact holes making direct contact only to portions of said titanium nitride layer at the bottom thereof.

6. The device of claim 2, wherein said titanium nitride layer extends both over predetermined portions of said device isolation region and also over predetermined portions of titanium silicide layers at the surface of said active device regions.

7. The device of claim 2,
   wherein said active devices comprise field effect transistors having gates formed from patterned portions of said first thin film layer, said first thin film layer providing a gate layer, and
   wherein said lines of said interconnect layer also make contact to said gate layer in predetermined locations.

8. The device of claim 7, wherein said gate layer is polycrystalline and comprises a substantial fraction of silicon.

9. The device of claim 8, wherein said gate layer comprises more than 80% silicon.

10. The device of claim 9, wherein said gate layer consists essentially of polycrystalline silicon.

11. The device of claim 7, wherein said gate layer comprises a silicide layer.

12. The device of claim 11, wherein said lines of said interconnect layer also make contact to said silicide layer portion of said gate layer in predetermined locations.

* * * * *